(12) United States Patent
Hung et al.

(10) Patent No.: US 8,288,789 B2
(45) Date of Patent: Oct. 16, 2012

(54) LED PACKAGE

(75) Inventors: Tzu-Chien Hung, Hsinchu Hsien (TW); Ya-Wen Lin, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 159 days.

(21) Appl. No.: 12/986,187

(22) Filed: Jan. 7, 2011

(65) Prior Publication Data

US 2011/0316024 A1    Dec. 29, 2011

(30) Foreign Application Priority Data

Jun. 29, 2010 (CN) .......................... 2010 1 0212068

(51) Int. Cl.
*H01L 31/05* (2006.01)
*H01L 31/052* (2006.01)

(52) U.S. Cl. ............... 257/98; 257/99; 257/E33.068; 438/26; 438/27

(58) Field of Classification Search .................. 257/98, 257/99, E33.56, E33.57, E33.061, E33.068; 438/26, 27
See application file for complete search history.

(56) References Cited

U.S. PATENT DOCUMENTS

| | | | | |
|---|---|---|---|---|
| 4,966,862 A * | 10/1990 | Edmond | ................. | 438/27 |
| 6,809,342 B2 * | 10/2004 | Harada | ................. | 257/79 |
| 7,176,502 B2 * | 2/2007 | Mazzochette et al. | .......... | 257/99 |
| 7,221,002 B2 * | 5/2007 | Okazaki et al. | ................. | 257/98 |
| 7,274,044 B2 * | 9/2007 | Kawakami et al. | ............. | 257/98 |
| 7,868,332 B2 * | 1/2011 | Rho et al. | ................. | 257/79 |
| 7,968,355 B2 * | 6/2011 | Kim | ................. | 438/22 |
| 8,097,896 B2 * | 1/2012 | Kim et al. | ................. | 257/99 |
| 2005/0224821 A1 * | 10/2005 | Sakano et al. | ................. | 257/79 |
| 2007/0138487 A1 * | 6/2007 | Watanabe et al. | ............. | 257/86 |
| 2009/0039371 A1 * | 2/2009 | Kim et al. | ................. | 257/98 |
| 2010/0109039 A1 * | 5/2010 | Kim | ................. | 257/98 |
| 2012/0176788 A1 * | 7/2012 | Van De Ven et al. | ......... | 362/231 |
| 2012/0187440 A1 * | 7/2012 | Kim | ................. | 257/98 |

\* cited by examiner

*Primary Examiner* — Allan R Wilson
(74) *Attorney, Agent, or Firm* — Altis Law Group, Inc.

(57) ABSTRACT

An LED package includes a transparent substrate, an LED die, and an encapsulating layer. The transparent substrate has a first surface defining a recess therein, a second surface opposite to the first surface, and a lateral surface interconnecting the first and second surfaces. The LED die is arranged on the bottom of the recess. The encapsulating layer is in the recess and covers the LED die. The LED package further includes a metal layer formed on the second surface and the lateral surface of the substrate. A pair of electrodes is located at the bottom of the recess and extends through the metal layer. An insulated material is filled between the transparent substrate and the electrodes. Light emitted from the LED die is transmitted through the transparent substrate and reflected by the metal layer.

10 Claims, 5 Drawing Sheets

LED PACKAGE

BACKGROUND

1. Technical Field

The present disclosure generally relates to LED technology, and particularly to an LED package.

2. Description of the Related Art

Light emitting diodes (LED)s have been promoted as a widely used light source by many advantages, such as high luminosity, low operational voltages, low power consumption, compatibility with integrated circuits, easy driving, long-term reliability, and environmental friendliness. LED's are commonly applied in a plurality of lighting applications.

However, LED packages must, overcome certain light extraction efficiency challenges. Referring to FIG. 1, a commonly used LED package 10 according to related art includes a substrate 11, a pair of electrodes 12, 13 arranged on lateral sides of the substrate 11 and a reflective cup 18 on the electrodes 12, 13. An LED die 15 is arranged on the electrode 12. The LED die 15 is electrically connected with the electrodes 12, 13 with wires 17, and an encapsulating layer 16 is in the reflective cup 18 covering the LED die 15. Light emitted from the LED die 15 and is reflected by the inner surface of the reflective cup 18, and then emits out from the top. However, the size of area of the reflective cup 18 will limit the light emitting area S and light extraction efficiency of the LED package 10.

What is needed, therefore, is an LED package, which can increase light emitting area and light extraction efficiency, and ameliorate the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the LED package. Moreover, in the drawings, like reference numerals designate corresponding parts throughout the views.

DETAILED DESCRIPTION

Embodiments of an LED package as disclosed are described in detail here with reference to the drawings.

Figure 1:
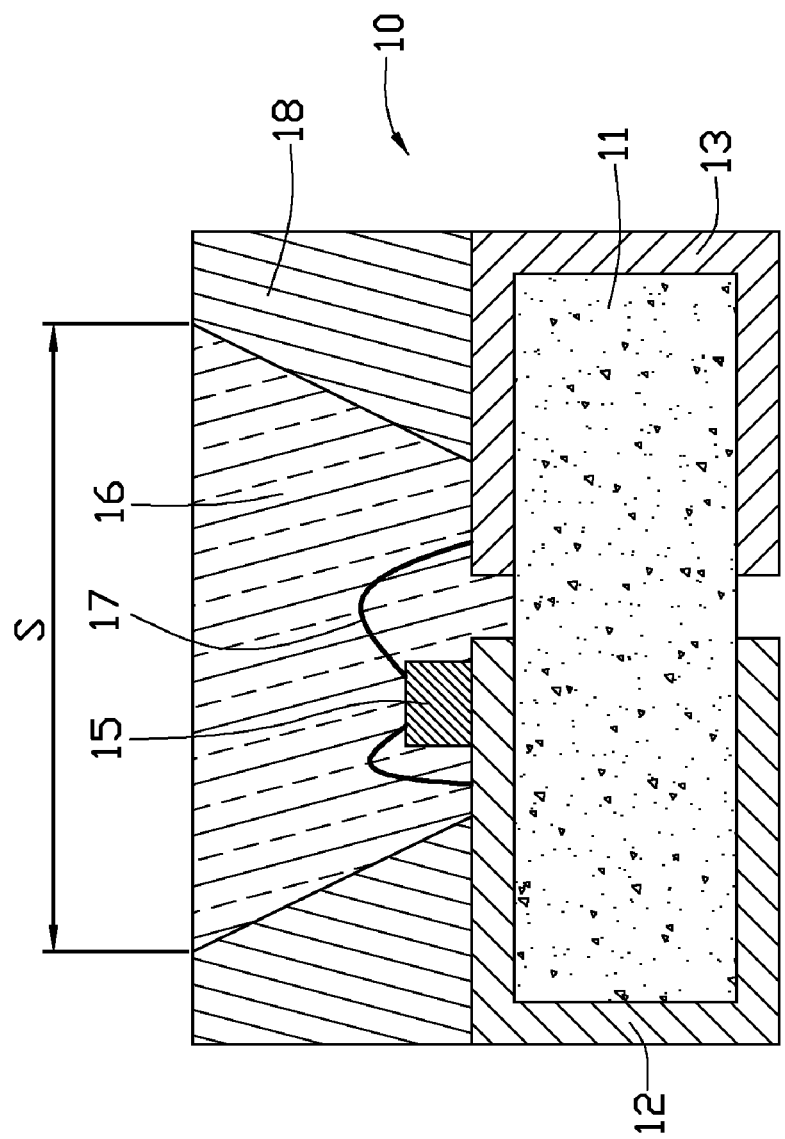
FIG. 1 is a schematic cross section view of a commonly used LED package in related art.
Figure 2:
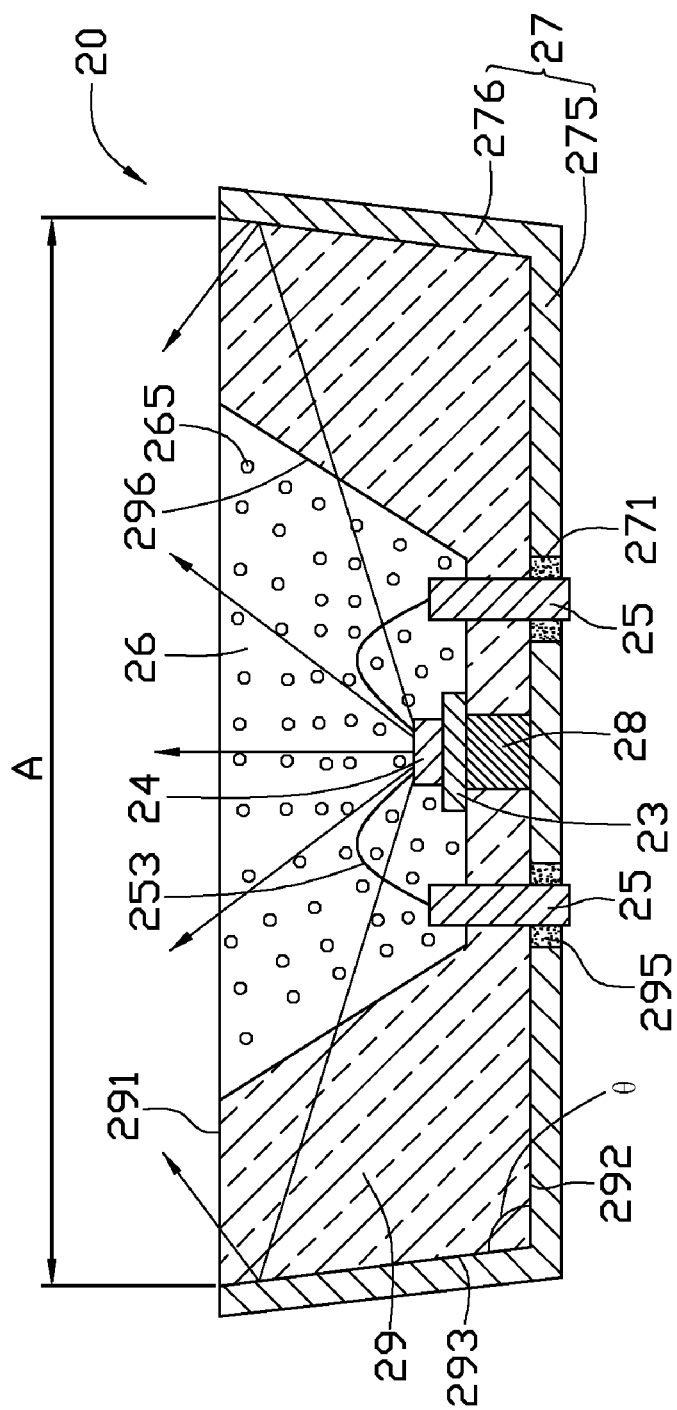
FIG. 2 is a schematic cross section view of an LED package in accordance with a first embodiment.
Figure 3:
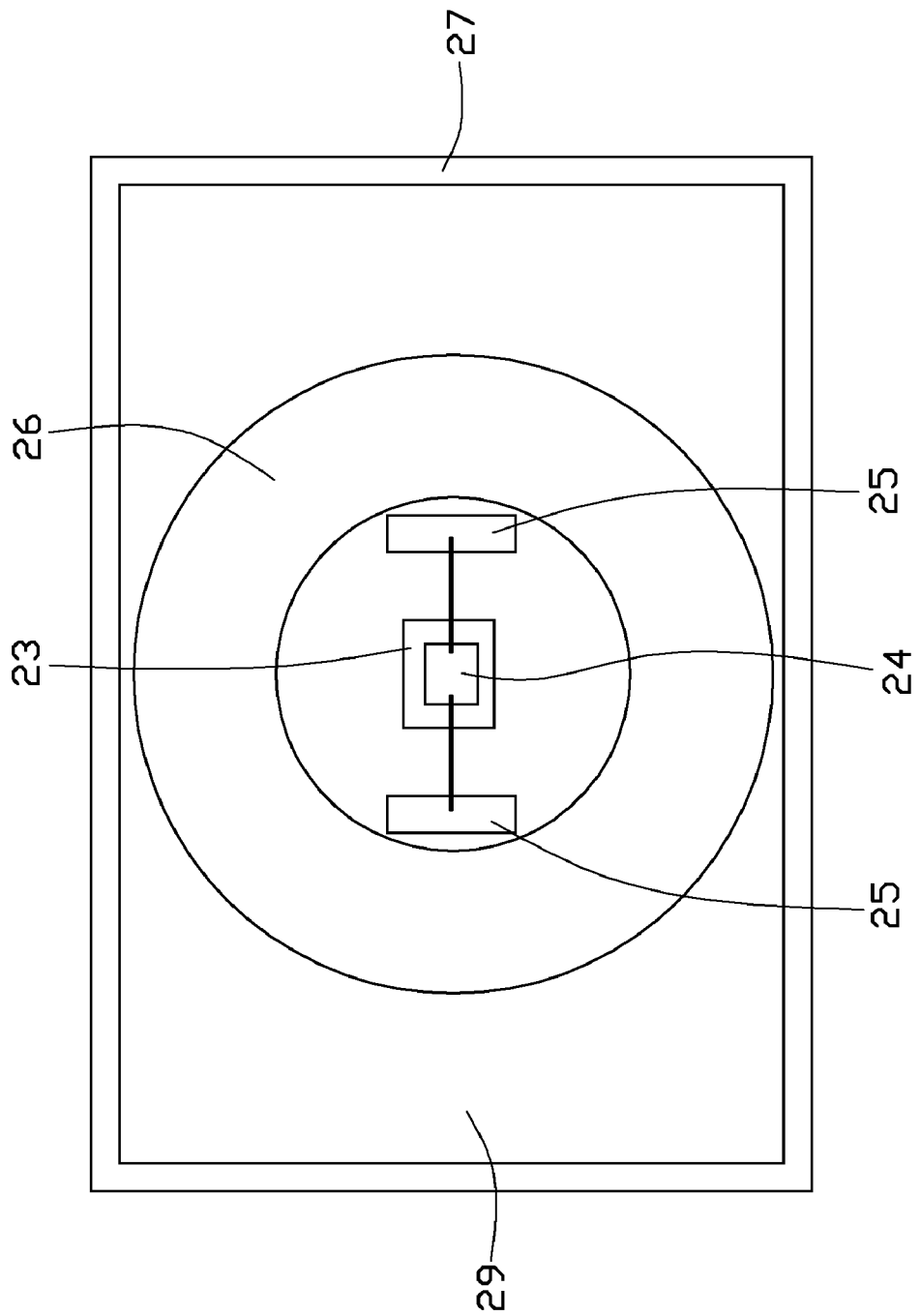
FIG. 3 is a top view of the LED package of FIG. 2.

Referring to FIG. 2 and FIG. 3, an LED package 20 in accordance with a first embodiment includes a transparent substrate 29, an LED die 24, and two metal electrodes 25. The transparent substrate 29 supports the LED die 24. The transparent substrate 29 includes a first surface 291, a second surface 292 opposite to the first surface 291, and a lateral surface 293 connecting with the first surface 291 and the second surface 292. A recess 296 is defined on the first surface 291 of the transparent substrate 29. The LED die 24 is arranged on the bottom of the recess 296 by a heat conductive substrate 23. The LED package 20 further includes a metal layer 27 covering the second surface 292 and the lateral surface 293 of the transparent substrate 29. The two metal electrodes 25 are arranged on the bottom of the recess 296 and extend through the second surface 292 of the transparent substrate 29 to the metal layer 27. An insulating material 295 is arranged to insulate the two metal electrodes 25 and the metal layer 27.

A heat conductive system is arranged inside the transparent substrate 29 connecting with the heat conductive substrate 23 and the metal layer 27 to conduct the heat from the LED die 24 to the metal layer 27. In this embodiment, the heat conductive system is a heat conductive pillar 28 which is arranged under the heat conductive substrate 23 and extends out to the second surface 292 of the transparent substrate 29 to connect with the metal layer 27.

The LED die 24 can be a compound semiconductor of group III-V elements or group II-VI elements. Light emitted from the LED die 24 can be visible, invisible, or a mixture of visible and invisible.

The two electrodes 25 are respectively arranged on two sides of the recess 296. The top of each electrode 25 is connected with the LED die 24 through the wire 253. The bottom of each electrode 25 passes through the transparent substrate 29 and the metal layer 27. An insulating material 295 insulates the metal layer 27 and the two electrodes 25 from short circuit. The insulating material 295 can be silicon, or epoxy resin.

The transparent substrate 29 can be quartz, SiN, glass, or transparent resin. An encapsulating layer 26 is arranged in the recess 296 to protect the LED die 24. The encapsulating layer 26 can be silicon or epoxy resin, doped with luminescent material 265. The luminescent material 265 can be garnet compound, silicate, sulfide, phosphate, nitride, oxynitride, or SiAlON.

Figure 4:
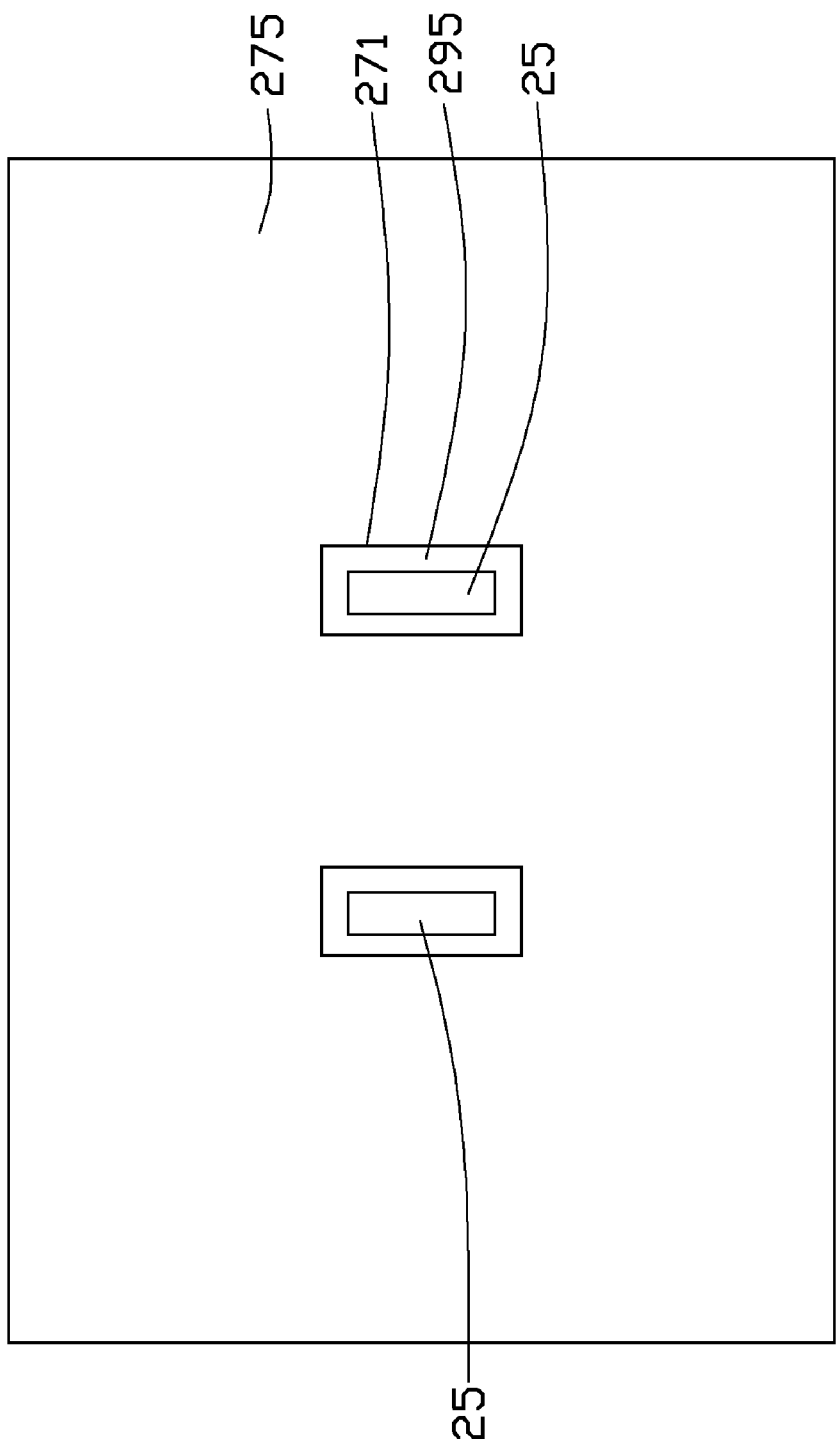
FIG. 4 is a bottom view of the LED package of FIG. 2.

Referring to FIG. 4, the metal layer 27 can be copper, aluminum, or silver. The metal layer 27 includes a bottom plate 275 covering the second surface 292 of the transparent substrate 29 and a side wall 276 covering the lateral surface 293. The bottom plate 275 of the metal layer 27 includes two spaced through holes 271. The shape of the through hole 271 is not limited and mainly in accordance with the shape of the electrodes 25. The size of the through hole 271 exceeds the size of the corresponding electrode 25 to make the bottom plate 275 and the bottom of the electrode 25 spaced evenly to fill the insulating material 295. An included angle θ is between the side wall 276 and the bottom plate 275. In this embodiment, the θ can be an angle between 90-150 degrees.

The heat conductive pillar 28 connects with the bottom plate 275 of the metal layer 27 and the heat conductive substrate 23 to conduct heat from the LED die 24 to the metal layer 27. The LED die 24 of the LED package 20 can be multiple, and each LED die 24 can correspondingly connect to a heat conductive pillar 28 connecting with the metal layer 27 or all LED dies 24 connect to a single heat conductive pillar 28 connecting with the metal layer 27.

Light emitted from the LED die 24 passes through the lateral surface 293 of the transparent substrate 29 and reflects from the side wall 276 of the metal layer 27 to increase the light emitting area A and light extraction efficiency. The included angle θ between the bottom plate 275 and the side wall 276 of the metal layer 27 can be adjusted to increase the reflection rate. Moreover, heat from the LED die 24 can rapidly conduct to the bottom plate 275 and side wall 276 of the metal layer 27 directly through the heat conductive pillar 28 to increase the heat dissipating efficiency of the LED package 20.

Figure 5:
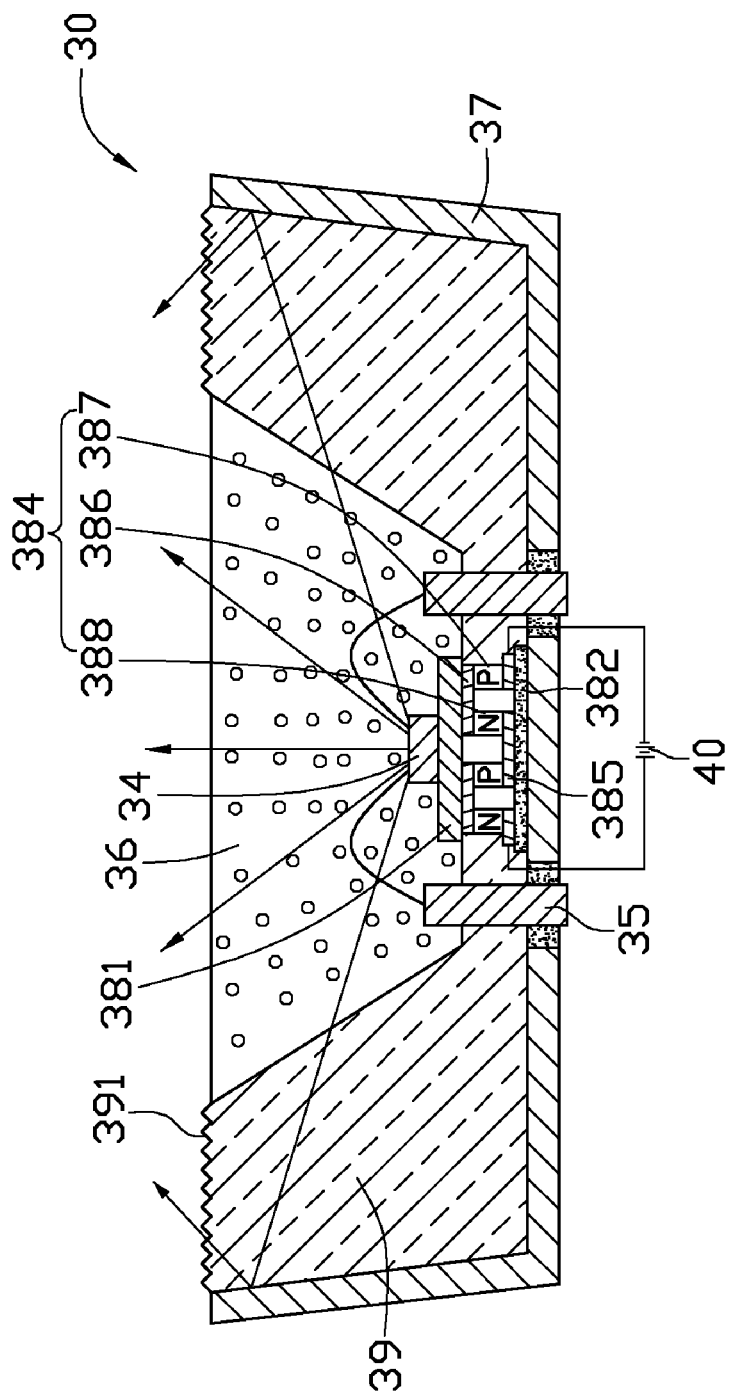
FIG. 5 is a schematic cross section view of an LED package in accordance with a second embodiment.

Referring to FIG. 5, an LED package 30 in accordance with a second embodiment includes a transparent substrate 39, an encapsulating layer 36, an LED die 34, two electrodes 35, a metal layer 37 covering the transparent substrate 39, and a heat conducting system. The difference from the first embodiment is that the first surface 391 of the transparent substrate 39 of the LED package 30 is rough. A cutting is arranged on the first surface 391 to decrease the possibility of total reflection on the transparent substrate 39 and increase the light extraction efficiency of the LED package.

In this embodiment, the heat conductive system is a thermoelectric cooler (not shown) including a first plate 381 contacting with the LED die 34, a second plate 382 contacting with the metal layer 37, and a thermoelectric cooling unit assembly between the first plate 381 and the second plate 382. The thermoelectric cooling unit assembly comprises a plurality of thermoelectric cooling units 384 in series. The adjacent two thermoelectric units 384 are electrically connected by an electrically conductive plate 385. Each thermoelectric cooling unit 384 includes an electrically conductive substrate 386, a P type semiconductor block 387, and an N type semiconductor block 388 arranged at one side of the electrically conductive substrate 386 and electrically connecting with the electrically conductive substrate 386. Two ends of the thermoelectric cooling unit assembly connect with a direct current power source 40.

The P type semiconductor block 387 and the N type semiconductor block 388 are solid state cubes respectively doped with Bi—Te, Sb—Te, Bi—Se, Pb—Te, Ag—Sb—Te, Si—Ge, Fe—Si, Mn—Si, or Cr—Si compound. In this embodiment, the P type semiconductor block 387 and the N type semiconductor block 388 are respectively P type $Bi_2Te_3$ and N type $Bi_2Te_3$.

When the direct current power source 40 provides electricity to the thermoelectric cooling unit assembly, the thermoelectric cooling unit 384 will have a Peltier Effect and the heat on the side of the first plate 381 conducts to the side of the second plate 382 through the P type semiconductor block 387 and the N type semiconductor block 388. The heat from the LED die 24 conducts through the first plate 381, the thermoelectric cooling unit 384, the P type semiconductor block 387, the N type semiconductor 388, and the second plate 382 to the metal layer 37.

It is to be understood, however, that even though numerous characteristics and advantages of the disclosure have been set forth in the foregoing description, together with details of the structures and functions of the embodiment(s), the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED package comprising:
    a transparent substrate having a first surface, a second surface opposite to the first surface, and a lateral surface connecting with the first surface and the second surface;
    a recess defined on the first surface;
    an LED die arranged on the bottom of the recess;
    an encapsulating layer in the recess and covering the LED die;
    a metal layer covering the second surface and lateral surface of the transparent substrate;
    a pair of metal electrodes arranged on the bottom of the recess and extended through the second surface and the metal layer; and
    an insulating material insulating the metal electrodes and the metal layer, wherein the metal layer reflects light emitted from the LED die and passed through the transparent substrate.

2. The LED package of claim 1, wherein the first surface of the transparent substrate is rough.

3. The LED package of claim 1, wherein the transparent substrate further comprises a thermoelectric cooler connecting with the LED die and the metal layer.

4. The LED package of claim 1, wherein the transparent substrate further comprises a heat conductive pillar connecting with the LED die and the metal layer.

5. The LED package of claim 4 further comprising a heat conductive substrate between the LED die and the heat conductive pillar.

6. The LED package of claim 1 further comprising a pair of metal wires electrically connecting with the LED die and the metal electrodes.

7. The LED package of claim 1, wherein the encapsulating layer includes luminescent material.

8. The LED package of claim 7, wherein the luminescent material is garnet compound, silicate, sulfide, phosphate, nitride, oxynitride, or SiAlON.

9. The LED package of claim 1, wherein the transparent substrate is quartz, SiN, glass, or transparent resin.

10. The LED package of claim 1, wherein an included angle which is 90-150 degree is between the second surface and the lateral surface.

* * * * *